(12) United States Patent
Norman

(10) Patent No.: US 7,662,301 B2
(45) Date of Patent: Feb. 16, 2010

(54) METHOD OF MAKING A FREE STANDING STRUCTURE

(75) Inventor: Carl E. Norman, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 285 days.

(21) Appl. No.: 10/677,264

(22) Filed: Oct. 3, 2003

(65) Prior Publication Data

US 2004/0137729 A1 Jul. 15, 2004

(30) Foreign Application Priority Data

Oct. 3, 2002 (GB) ................................. 0222930.0

(51) Int. Cl.
*B44C 1/22* (2006.01)
(52) U.S. Cl. ........................... 216/57; 216/91; 216/102
(58) Field of Classification Search .................. 216/57, 216/91, 102
See application file for complete search history.

(56) References Cited

U.S. PATENT DOCUMENTS

| | | | |
|---|---|---|---|
| 5,129,974 A | 7/1992 | Aurenius | |
| 6,096,175 A * | 8/2000 | Roth | 204/192.15 |
| 6,790,298 B2 * | 9/2004 | Johnson et al. | 148/561 |
| 6,919,009 B2 * | 7/2005 | Stonas et al. | 205/74 |
| 2001/0001472 A1 * | 5/2001 | Sano et al. | 235/462.01 |
| 2002/0076575 A1 * | 6/2002 | Yang et al. | 428/689 |
| 2003/0053190 A1 * | 3/2003 | Liang et al. | 359/296 |
| 2004/0002752 A1 * | 1/2004 | Griffin et al. | 623/1.15 |
| 2004/0071951 A1 * | 4/2004 | Jin | 428/323 |

FOREIGN PATENT DOCUMENTS

| | | |
|---|---|---|
| CH | 624 434 | 7/1981 |
| GB | 2 306 484 | 5/1997 |
| GB | 2 320 571 | 6/1998 |
| WO | WO 00/16893 | 3/2000 |
| WO | WO 01/78889 | 10/2001 |

* cited by examiner

*Primary Examiner*—Binh X Tran
(74) *Attorney, Agent, or Firm*—Oblon, Spivak, McClelland, Maier & Neustadt, L.L.P.

(57) ABSTRACT

A method of producing a free standing structure, the method comprising: providing a substrate having a raised pattern formed on a surface of said substrate, said raised pattern comprising at least one material which forms said surface; depositing material over said raised pattern; and dissolving said substrate to release said deposited material to form said free standing structure from said released deposited material.

21 Claims, 17 Drawing Sheets

220  216  212

230  232

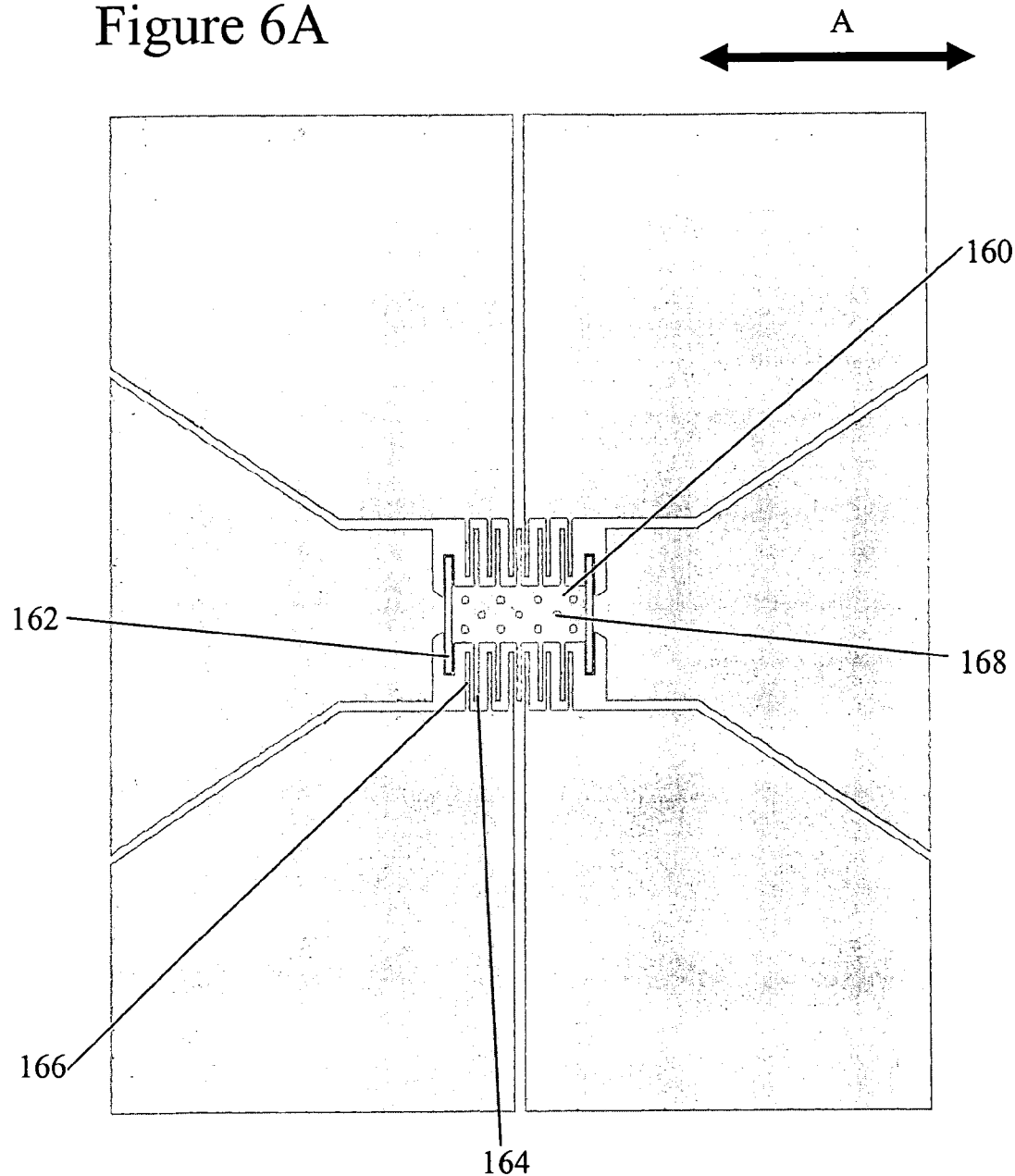

METHOD OF MAKING A FREE STANDING STRUCTURE

FIELD OF INVENTION

The present invention relates to the field of making free standing structures, and in particular, to the field of making free standing nano structures or microstructures.

BACKGROUND OF THE INVENTION

Custom shaped free-standing nano structures and microstructures have many uses, for example, as support particles in combinatorial chemistry and as labels for molecules. Known methods of creating custom shaped micro particles are described in GB 2306484 and WO 00/16893.

In GB 2306484, a method is described of making solid support particles marked with a machine readable code, for use in combinatorial chemistry techniques. The particles are made using deposition, etching and lift-off techniques similar to those used to make micro electronic integrated circuits and micro electromechanical systems (MEMS). A silicon wafer substrate is coated firstly with a soluble sacrificial layer, then with a layer from which the particles will be made, finally with a layer of photosensitive polymer resist. The layer of photosensitive polymer resist is exposed to ultraviolet light through a photolithographic mask which defines the particle shapes. The particles are created by removing unexposed resist and etching away the revealed areas of material around the particles. The particles may then be freed from the silicon wafer substrate by dissolving the sacrificial layer which underlies the particles. The particles may be patterned with text, holes, grooves or notches. This creates a code, which is readable optically to identify each particle. The particles are sized with a longest dimension of between 1 and 500 microns.

In WO 00/16893, a method of making micro-barcode labels is described. The labels are made by standard optical lithography and dry etching, and the barcode is stored as a series of holes in the micro labels. The labels are made of aluminium and are anodised to allow the attachment of a wide range of biochemically active agents for use as highly selective probes. Each micro label is typically of a size of about 100 microns long by 10 microns wide by 1 micron thick.

Although both of the above methods allow small free standing structures to be fabricated, they both suffer from the problem that they require rather complicated and time consuming fabrication techniques.

SUMMARY OF THE INVENTION

The present invention at least partially addresses the above problems and, in a first aspect, provides a method of producing a freestanding structure, the method comprising providing a substrate having a raised pattern formed on a surface of said substrate, said raised pattern comprising at least one material which forms said surface; depositing material over said raised pattern; and dissolving said substrate to release said deposited material to form said freestanding structure from said released deposited material.

The use of a patterned substrate is advantageous, because it eliminates the need for a masking and etching process to make the free standing structures. This makes the process cheaper, quicker, easier and more reliable than in the prior art, where part of the layer from which the free standing structure is made is etched away to create the shape of the free standing structure.

The patterned substrate may be produced from a mould by injection moulding, insert moulding or by pressing. For example the mould may be plate shaped and may be pressed directly onto the substrate to emboss a pattern in it. This allows substrates to be mass produced. Alternatively, the mould may be in the form of a roller and the pressing may be done by rolling the mould across the surface of the substrate. This rolling method has the advantage that it can be done continuously across a large area of substrate.

A further alternative is that the substrate may be produced by a solvent replication method. Said method comprises the steps of providing a solvent between a substrate and a mould and pressing the substrate against the mould to allow the solvent to partially dissolves the substrate and adopt a shape complimentary to the mould. The solvent evaporates and the mould is then removed, to leave a substrate of the desired shape.

The mould may be made by a number of techniques such as wet etching, reactive ion etching (RIE) or laser processing techniques. In laser processing techniques, a laser is focussed to ablate a small area of the substrate, the depth of the substrate ablated may be controlled by the exposure time of the laser to the substrate. As the laser may be focussed to a small spot size (e.g. to below 1 μm in the far field, or tens of nanometers in the near field) it is possible to etch 3D patterns with the laser by varying the laser exposure time over various areas of the substrate. Wet etching may also be used to create a mould with 3D patterns using so-called preferential etchants which preferentially etch certain crystallographic planes quicker than others.

As the quality of the surfaces of the free standing structure will be dictated by the quality of the surfaces of the patterned substrate, it is desirable to form a mould, regardless of the substrate patterning method, which has good quality surfaces.

Thus, in a second aspect, the present invention provides a method of producing a mould for making a substrate with a raised pattern, said method comprising:

providing a mould material having a buried sacrificial layer, said sacrificial layer being parallel to a main surface of said mould material;

masking the main surface of said mould material with a mask pattern;

etching the mould material through said mask pattern with a first etch;

stopping said first etch at an etch stop level within said sacrificial layer; and etching the mould material with a second etch, to selectively remove the sacrificial layer below said etch stop level.

The first etch may be performed by reactive ion etching. This etches through the mould material and into the sacrificial layer. The etching time is chosen so that the etch will stop within the sacrificial layer.

The second etch may be a wet etch. The second etch may act more slowly than the first etch. Preferably, it will only etch the sacrificial layer, and not the mould material. However, it is possible that it will etch the mould material at a slower rate than it etches the sacrificial layer. Since the second etch selectively removes the sacrificial layer below the stop level, a good quality surface is formed by the mould material below the sacrificial layer.

The second etch may laterally etch the sacrificial layer to form an undercut. The undercut should be small enough to allow the substrate to be removed from the mould without damage. The mould may then be used to make a substrate with pillars or steps which have a slight overhang. The maximum useful size of the undercut on the mould will be dependent on the pliability of the substrate material.

Further etching stages may also be performed. These further etches may define patterns with surfaces which are parallel, perpendicular or at some other angle to the main surface.

The material used to make the mould should be hard and micromachinable. Some preferred mould materials are silicon, silicon dioxide (including glass or quartz), $Si_3N_4$, sapphire, GaN, Al, and steel. For a silicon mould, the sacrificial layer could be silicon dioxide. For a metal mould, the sacrificial layer could be a different type of metal.

The present invention has the advantage over the prior art that a better quality of mould may be produced with a higher resolution of pattern. Once the mould has been made, it is very easy to mass produce high quality substrates in order to make freestanding structures, such as micro-barcodes, small antennas, MEM devices or custom shaped particles. The process of making the substrate, and the process of making the free standing structures do not require the use of reactive ion etching, making these processes easier and cheaper.

The pattern which masks the mould material may define a pattern on said substrate comprising a substantially planar upper surface separated from a lower level by vertical sidewalls. Holes may also be provided in said upper surface. The mould may also define a 3D pattern comprising a non-flat upper surface.

Generally, the raised pattern will be made from the same material as the substrate, and is integral with the substrate.

The substrate may also comprise a second pattern of lower relief than the raised pattern, the second pattern being separated from the raised pattern by a step. Again, preferably, the step is at an angle such that material is not deposited onto it, and yet more preferably, it is substantially vertical. Material may be deposited over the second pattern. The second pattern of lower relief may make up the rest of the surface, or there may be a third, fourth pattern, etc, at other levels. Thus preferably, the mould may have a plurality of different levels such that a substrate is formed having a plurality of different levels. For example, said substrate may be used to produce two or more free standing structures from different levels on said substrate.

One preferred example of a pattern for the free standing structure is a barcode pattern. This barcode pattern may comprise a strip with a plurality of holes, where the arrangement of holes determines the unique code of the strip. The barcode may be encoded according to the positions of the holes, the sizes, shapes or orientations of the holes, or some combination of these. The holes may be arranged along the length of the strip in a barcode style pattern.

Alternatively the free standing structure may comprise a plurality of notches cut into the sides of the strip, where the arrangement of the notches determine the unique code of the strip. Again, the positions, sizes, shapes or orientations of the notches or some combination of these may determine the unique bar code pattern. The notches may be cut into a single side of the strip, or into alternative sides of the strip to produce a "snake-like" pattern. This has the advantage of eliminating small pieces of waste such as the waste material that will arise from the holes, and may subsequently block the holes of the bar code pattern. Thus, when the barcode patterns are made, there will be no problem with trying to separate small pieces of waste from the desired freestanding bar code structures.

The shape of the bar code tag, or another desired pattern shape, may correspond to the shape of the raised pattern on the substrate. The bar code tag will thus be formed on top of pillars or raised areas of substrate. In that case, waste material corresponding to the holes of the bar code, and the area surrounding the bar code, will be deposited onto the second pattern of lower relief on the substrate. When the substrate is exposed to a solvent, the pillars or raised areas will dissolve before the main bulk of the substrate. Thus, the barcode tag will be released from the raised pattern whilst leaving the waste still attached to the substrate.

Alternatively the barcode pattern, or other desired pattern, may correspond to the shape of the second pattern of lower relief on the substrate. In this case, the waste material from the holes of the barcode would be deposited on top of the raised pattern of the substrate. Then, when the pillars are dissolved by a solvent, the waste material will be released first, whilst the desired barcode structure is held in position on the substrate. The waste may be removed by being carried away by a suitable flow of liquid. After the waste has all been removed, the desired barcode pattern may then be released from the substrate by a further dissolving stage, releasing it into solution without any contamination from waste particles. This second method may also be particularly useful for making free standing structures with a fairly large area compared with the area of the waste material, e.g. for a micro membrane or mesh with a large number of small holes. This is because the large surface area of the membrane or mesh would mean that it is likely to take longer for the solvent to dissolve the substrate below the membrane or mesh, than to dissolve away the smaller area beneath the waste material.

The invention may also be used to make free standing structures for use in micro electromechanical devices (MEMs). Motion sensors or accelerometers may be made with a freestanding metal or metal oxide structure, where external motion will affect the electrical properties of the free standing structure. For example the structure may comprise at least two narrowly separated members each capable of holding an electrical charge such that there is a capacitance between said members, at least one of the members being moveable with respect to the other. Movement of one member relative to another affects their separation, thus changing the capacitance between them. A change in capacitance can be detected to indicate that motion has occurred. The members may be plate shaped, and the member capable of movement may be a freestanding structure suspended on a thin arm.

Another possible use of the invention is to make an antenna. The antenna may be of a miniature size, and may comprise a filament or loop of metal extending from a metal contact pad. A semiconductor chip, such as an RF chip, may be bonded to the contact pad. Alternatively, the antenna loop and contact pads may constitute a simple RC circuit, which is itself detectable by scanned RF pulses.

A further application of the invention is to make a large number of particles of a desired size or size distribution. These particles may be used as colloidal particles, as chemical tags or encoded carrier particles, or in so called "magnetic wood".

"Magnetic wood" is the name colloquially given to a solid material having a plurality of magnetic particles provided on a surface of said solid material, embedded within said material or interposed between two sheets of solid material. Typically, the solid material is wood, plywood or other building material. The magnetic particles may be ferritic, or they may comprise cobalt or nickel.

The magnetic wood blocks out radio signals, for example, it can block out mobile phone frequencies to prevent mobile phones from ringing in restaurants, theatres, etc. However a major difficulty with magnetic wood is that it also blocks out signals of emergency services. By providing magnetic wood with a controlled particle shape and size distribution, it may be possible to tune it to block only certain frequencies. Emergency services radio signals could then pass through whilst ordinary mobile phone frequencies are blocked. The present invention can be used to manufacture a controlled size and shape distribution of magnetic particles for use in magnetic wood.

When producing small particles for "magnetic wood" or other purposes, it is desirable to use a patterned substrate where the pattern comprises a plurality of levels. This allows particles to be closely packed as particles may be provided laterally adjacent to one another, but provided on different levels. For example, to make a plurality of hexagonal shaped particles in the most efficient way, it is desirable to have three different levels formed on the substrate. Every hexagon is surrounded by six other hexagons, each of which may be at one of the two different levels to the central hexagon. The surrounding six hexagons may alternate between these two levels so that neighbouring hexagons are always at different levels. This means that the complete plane can be tiled with hexagon shapes, without any neighbouring hexagons being on the same level. It is then very simple to release all the hexagons together by dissolving the substrate.

The material which is deposited to form the free standing structure may be a metal, for example aluminium. The metal may be anodised or otherwise treated to allow a wide range of biochemically active agents to bind to it. Alternatively, the material which is deposited to form the free standing structure may be a non-metal. Some preferred materials for making the free standing structure are Al, aluminium silicon alloy, $Al_2O_3$, Sb, As, Ba, $BaTiO_3$, Be, Bi, B, Cd, CdO, CdSe, CdS, Ca, C, $CeO_2$, Cr, Co, Cu, Ga, GaAs, GaP, Ge, Germanium oxide, Au, In, indium oxide, Fe, $Fe_2O_3$, $Fe_3O_4$, Pb, Li, LiF, Mg, $MgF_2$, Mn, Mo, Ni, nichrome, Nb, Pd, Pt, Se, Si, $SiO_2$, SiO, $Si_3N_4$, Ag, Ta, Te, Sn, tin oxide, Ti, $TiO_2$, TiO, W, Zn, ZnSe, ZnS and Zr. Combinations of the above materials are also possible. The material chosen will depend to a certain extent on the intended use of the resultant free standing structure.

Preferably, the thickness of an aluminium layer deposited onto the substrate would be between 10 nm and 10 µm, and even more preferably, around 1 µm. This preferred thickness range may vary if a different material was used.

The deposited material may be deposited onto the substrate by electron beam evaporation. It is also possible to use thermal deposition, whereby the material is heated so that it evaporates over the substrate. However, this will tend to be less useful for producing thicker layers because the amount of material available for deposition is limited. It will also tend to heat the substrate more than in the case of electron beam deposition, and it is undesirable to get the substrate too hot, as it may scorch or burn.

The substrate is preferably made of a material which is injection mouldable. Some preferred substrate materials are cellulose acetate (CA), ethyl cellulose, cellulose acetate butyrate, cellulose acetate propionate, acrylonitrile-Butadiene-Styrene (ABS), Nylon (PA), polycarbonate (PC), polypropylene (PP) and polystyrene (PS). Various solvents could be used to dissolve the substrate.

A further aspect of the invention provides an apparatus for producing a free standing structure, the apparatus comprising: means for providing a substrate having a raised pattern formed on a surface of said substrate, said raised pattern comprising at least one material which forms said surface; means for depositing material over said raised pattern; and means for dissolving said substrate to release said deposited material to form said free standing structure from said released deposited material.

The means for providing a substrate may be a machine to mass produce substrates from a mould, e.g. an injection moulding machine or a machine comprising a mould in the shape of a roller, which continually presses out substrates of the required shape.

The means for depositing may comprise an evaporator which can deposit layers of metal film. The evaporator may be an electron beam or thermal evaporator. The means for dissolving said substrate may comprise a spray for washing the substrate with solvent. The apparatus may further comprise a centrifuge or filtration media to remove the deposited material from the solvent.

BRIEF DESCRIPTION OF THE DRAWINGS

Preferred embodiments of the invention will now be described by way of example only, with reference to the accompanying drawings, in which

FIG. 6A shows an example design for an accelerometer.

DETAILED DESCRIPTION OF THE INVENTION

Figure 1A:
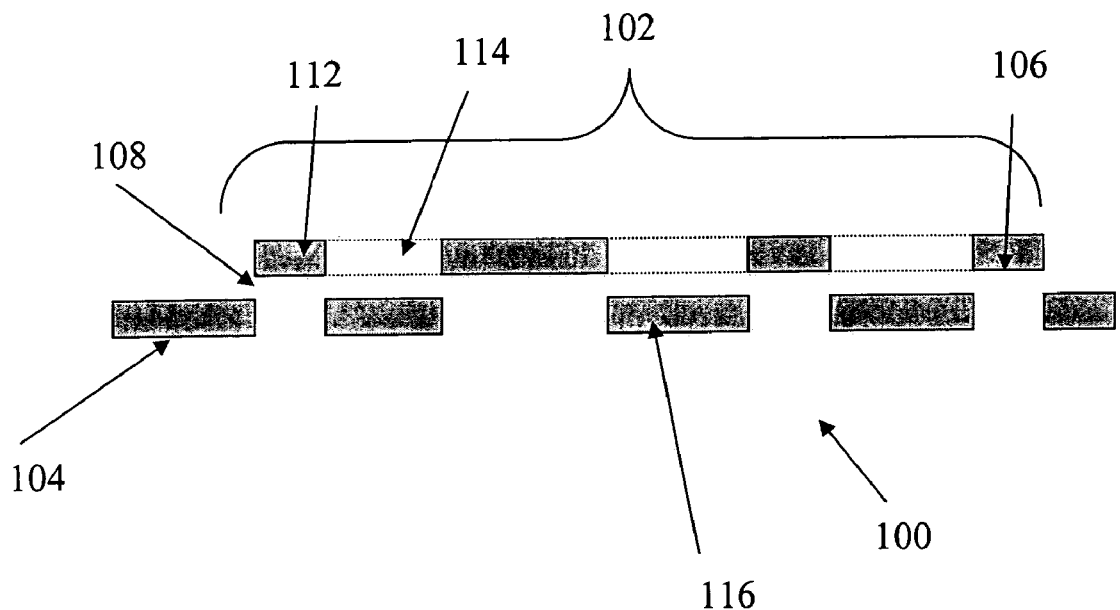
FIGS. 1A and 1B show a cross sectional view of the production of a freestanding aluminium layer to make a barcode structure, according to a first embodiment of the invention.
Figure 1B:
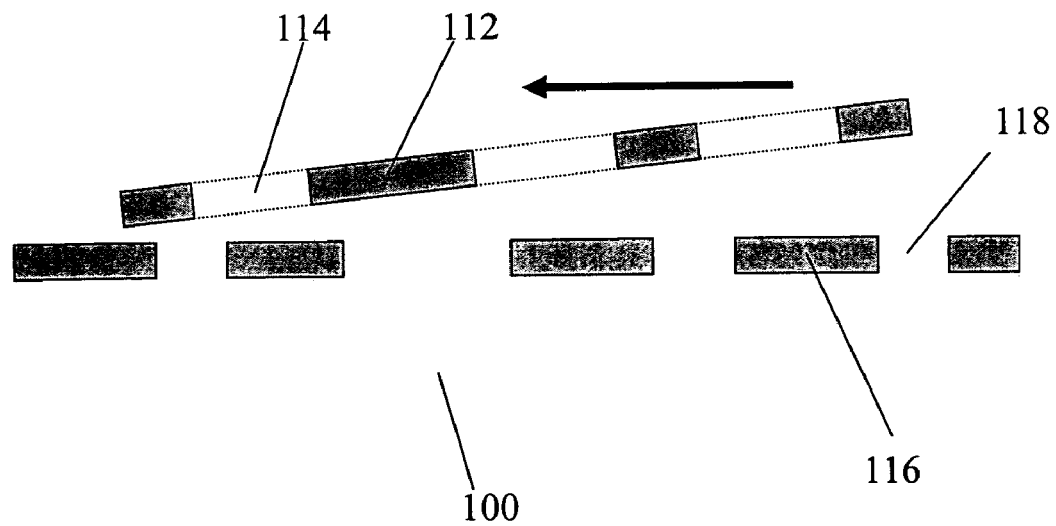

FIGS. 1A and 1B are cross sectional views, showing two stages in the production of a freestanding aluminium structure according to the first embodiment of the invention.

In FIG. 1A, a soluble substrate 100 has a raised pattern 102 provided on lower substrate level 104. The pattern 102 defines an upper level 106 which is separated from the lower level 104 by substantially vertical side walls 108.

FIG. 1A is a cross section through pattern 102, such that the pattern 102 appears as a plurality of vertical pillars. In reality the pillars are elongated into the plane of the paper and are connected at their ends to form, in this embodiment, a continuous structure as indicated by the dotted lines.

In FIG. 1A, an aluminium layer has been deposited onto the substrate 100 such that there is an upper aluminium coating 112 formed on upper level 106 and a lower aluminium coating 116 formed on lower level 104. The aluminium deposition is directional such that no aluminium is provided on the side walls 108. The side walls 108 cause the upper aluminium coating 112 to be discontinuous from the lower aluminium coating 116. Due to the overall shape of pattern 102, the sections of upper aluminium coating 112 are all connected to each other to form an essentially planar structure.

In the method of the embodiment described with reference to FIGS. 1A and 1B, the substrate 100 is dissolved in order to release the upper coating 112 of aluminium.

FIG. 1B shows the stage of the process after the substrate 100 has been partially dissolved to release upper aluminium coating 112. The substrate is dissolved by placing it in a flowing solvent. The flow direction of the solvent is indicated by the arrow.

The raised pattern 102, on which the upper aluminium coating 112 was deposited, is dissolved away, releasing upper aluminium coating 112. This leaves areas of exposed substrate 118 remaining together with the lower aluminium coating 116.

The released upper aluminium coating 112 is swept away by the flowing solvent. In this specific embodiment, the upper aluminium coating forms a free standing structure which may be used as a bar code. The structure being essentially planar with a plurality of parallel substantially elongate holes 114 formed therein.

Figure 2A:
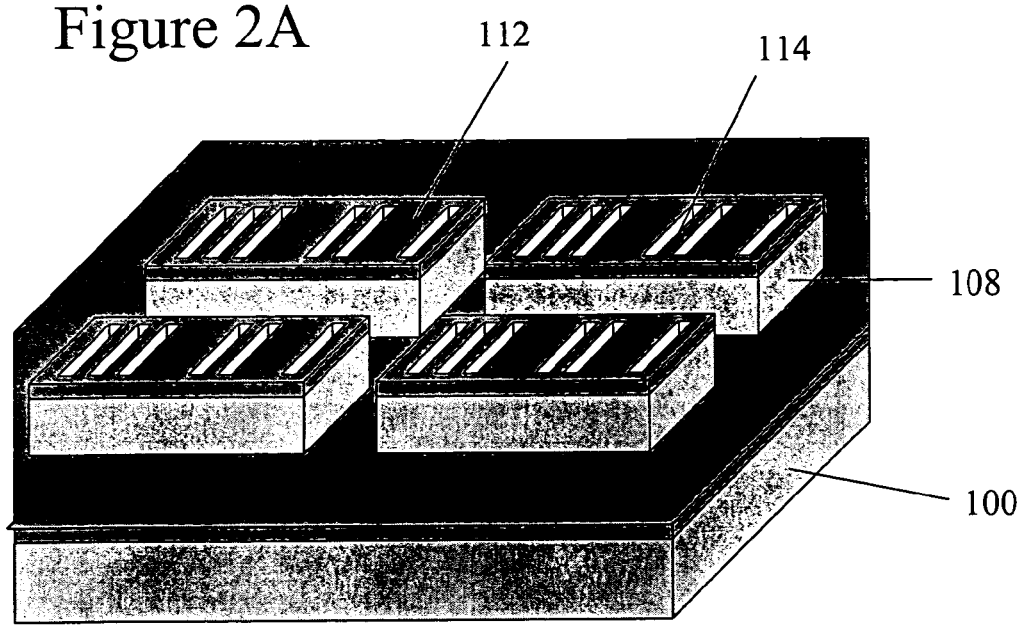
FIGS. 2A and 2B show a perspective view of the process shown in FIGS. 1A and 1B.
Figure 2B:
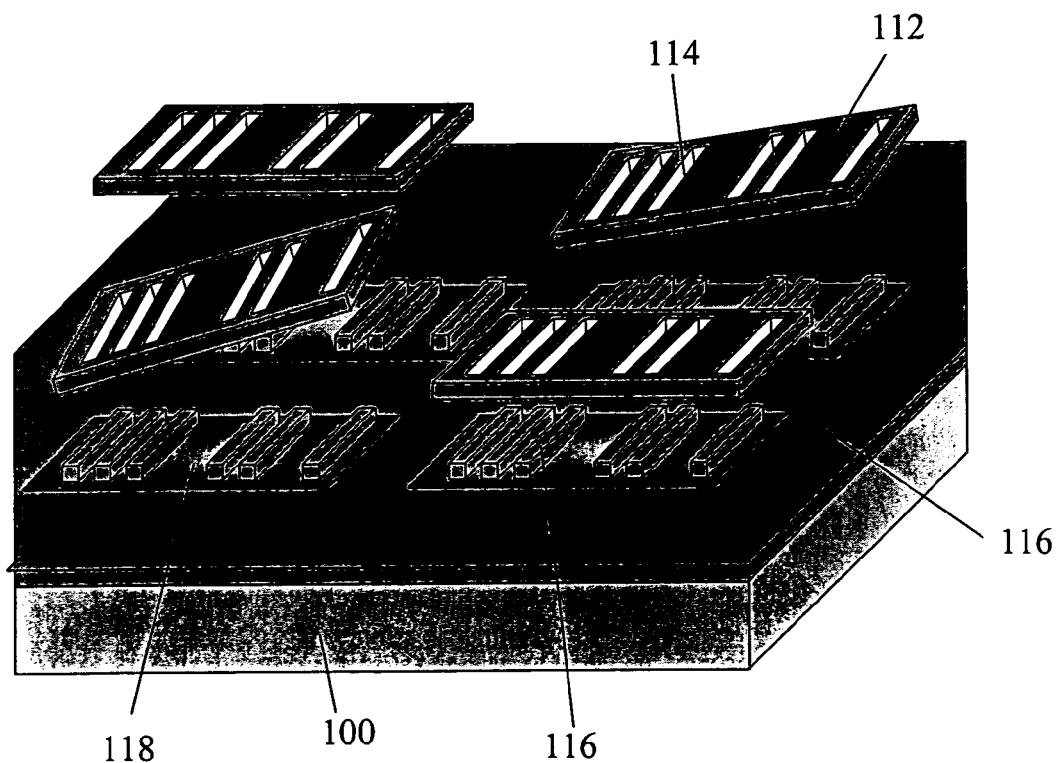
Figure 3A:
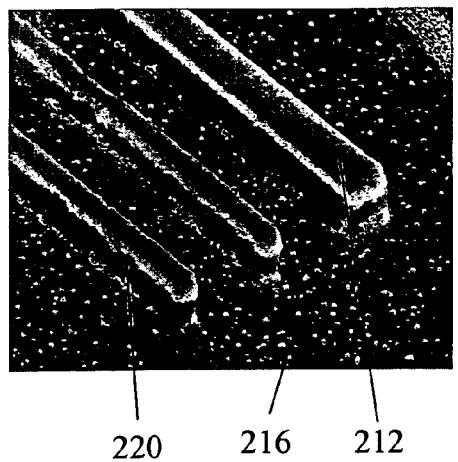
FIGS. 3A-D are micrographs of real materials made by the process shown in FIGS. 1A and 1B.
Figure 3B:
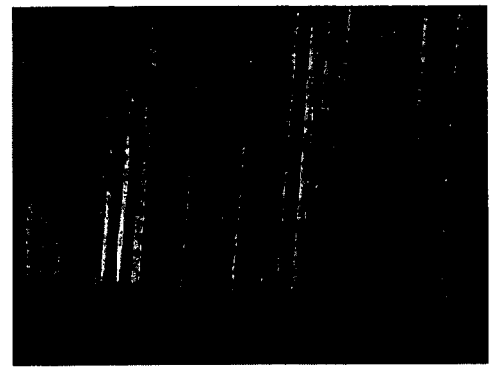
Figure 3C:
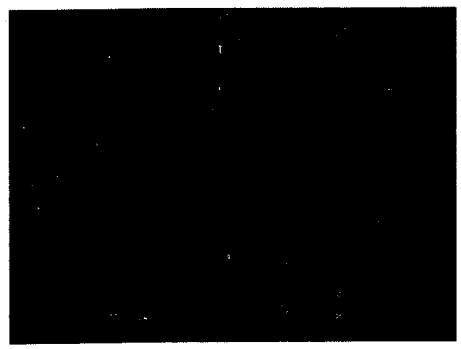
Figure 3D:
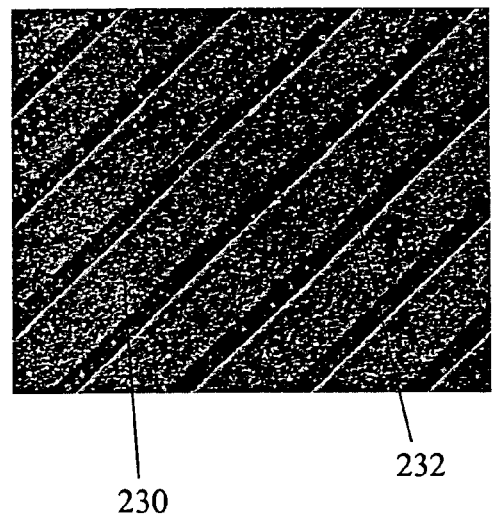

In FIGS. 2A and 2B, 3D perspective views are shown, corresponding to the cross sectional views of FIGS. 1A and 1B respectively. To avoid unnecessary repetition, like reference numerals will be used to denote like features.

In FIGS. 2A and 2B the barcode structure is clearly shown, with holes 114 arranged at different spacings along the length of the barcode 112. When the top layer of substrate is dissolved, the barcodes 112 are released, leaving waste material 116 in place on the substrate.

An example of this process in a real material is shown in FIG. 3A to 3C. FIG. 3A shows a SEM photograph of metal strips deposited onto a pattern comprising a plurality of raised ridges 212 formed in the surface of a soluble substrate. The ridges 212 have a width of less than 1 µm. The top of each of the ridges and the surrounding area 216 of lower-lying flat substrate are coated with metal, but the steps 220 on the sides of the ridges are not coated with metal, showing the exposed substrate.

FIG. 3B shows an optical micrograph corresponding to FIG. 3A. The ridges 212 are shown from above at a lower magnification. It can clearly be seen how different thicknesses of line and different spacings of line may be used to build up a barcode pattern to uniquely identify a tag.

FIG. 3C shows an optical micrograph of the metal strips floating free in solution after the substrate has been dissolved. As described with reference to FIGS. 1A, 1B, 2A and 2B, the metal which has been deposited on top of the ridges 212 is released by dissolving the substrate in the solvent. It is these metal strips which are seen floating in the solvent in the micrograph of FIG. 3C.

FIG. 3D is a micrograph showing a further substrate having diagonal ridges 230 separated by narrow diagonal trenches 232. The width of each trench 232 is just 360 nm. The total width of a trench 232 plus ridge 230 is 2 microns. An aluminium layer has been deposited on top of the silicon substrate, producing metallic strips. These strips may be extracted from the substrate by dissolving the substrate as previously explained.

Figure 4A:
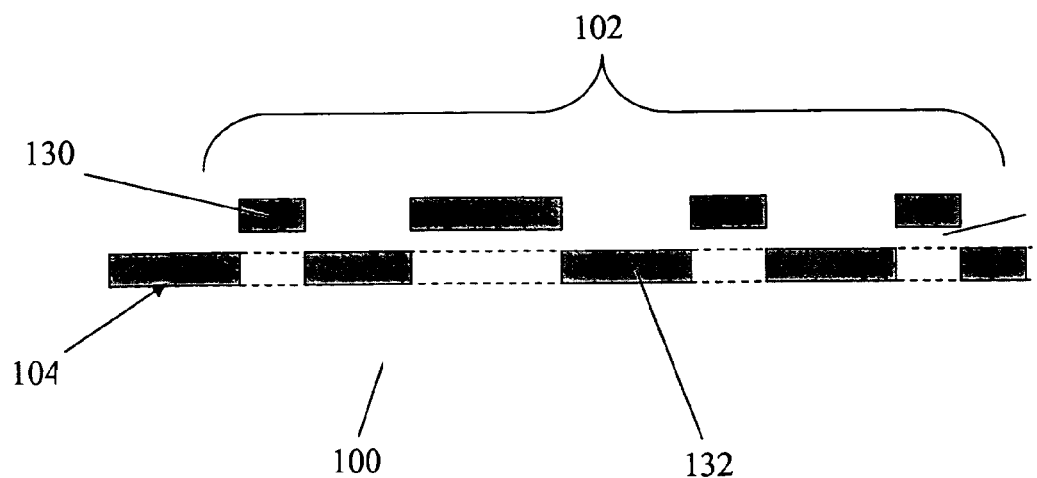
FIGS. 4A-D show a cross-sectional view of the production of a freestanding aluminium layer according to a second embodiment of the invention.

A second embodiment of the invention is demonstrated in FIGS. 4A-D. FIG. 4A shows a cross-sectional view of the stage of the process before any of the substrate 100 has been dissolved, and corresponds to FIG. 1A. Again, the substrate 100 has a raised pattern 102 provided on a lower level 104 of substrate 100.

A cross section of the pattern is illustrated in FIG. 4A. The pattern 102 comprises a plurality of ridges. Unlike the pattern described with reference to FIGS. 1A, 1B, 2A and 2B, ridges 130 are not connected to each other.

An aluminium layer is deposited onto the substrate, creating upper aluminium coating 130 on top of pattern 102 and lower aluminium coating 132 on lower level 104. The upper aluminium coating is in the form of a plurality of islands and the lower aluminium coating 132 forms a generally planar structure with elongated holes defined by the ridges that constitute pattern 102.

In this embodiment the higher level of aluminium is the waste material, and the lower level of aluminium is the desired pattern for the free standing structure.

Figure 4B:
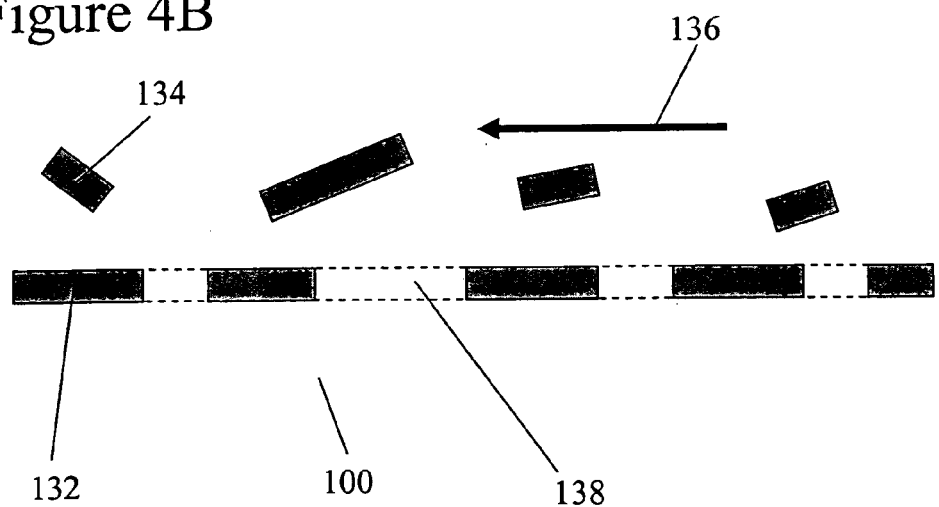

FIG. 4B shows the stage of the process after part of the substrate has been dissolved. In the same manner as FIG. 1B, the upper aluminium coating 130 is released from the substrate. As this coating is waste, it is washed away.

The remaining substrate 100 continues to hold the lower aluminium coating 132, with the desired pattern, in place.

Figure 4C:
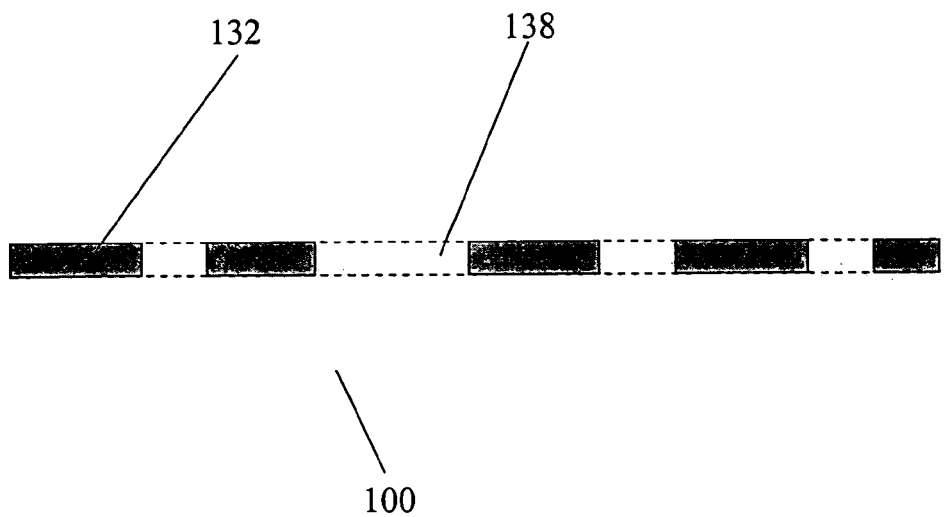

FIG. 4C shows the stage of the process where upper aluminium coating 130 and the pattern 102 has been removed. The lower aluminium coating 132 with the desired pattern is still attached to the substrate 100, after the debris has been removed. The holes 138 in the free standing structure 132 can be seen in cross section.

Figure 4D:
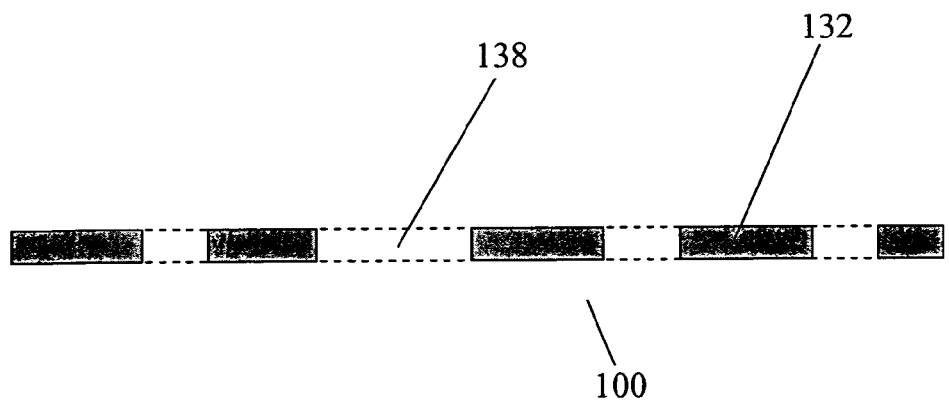

FIG. 4D shows the situation after a further part of the substrate 100 has been dissolved, to release the lower aluminium coating 132 and hence provide the desired free standing structure. The process shown in FIGS. 4A-D may be more useful than that shown in FIG. 1 in the case where the desired structure has a fairly large area compared to the area of waste is removed from it.

For example, to produce micro-porous membranes or micro-meshes, it may be much easier to get rid of the waste material first, leaving the remaining aluminium fixed to the substrate and ready to release when necessary. The process shown in FIGS. 4A-D may be less useful in the situation where the desired part of the aluminium structure has a small area, and the area of the waste material is large.

Figure 5:
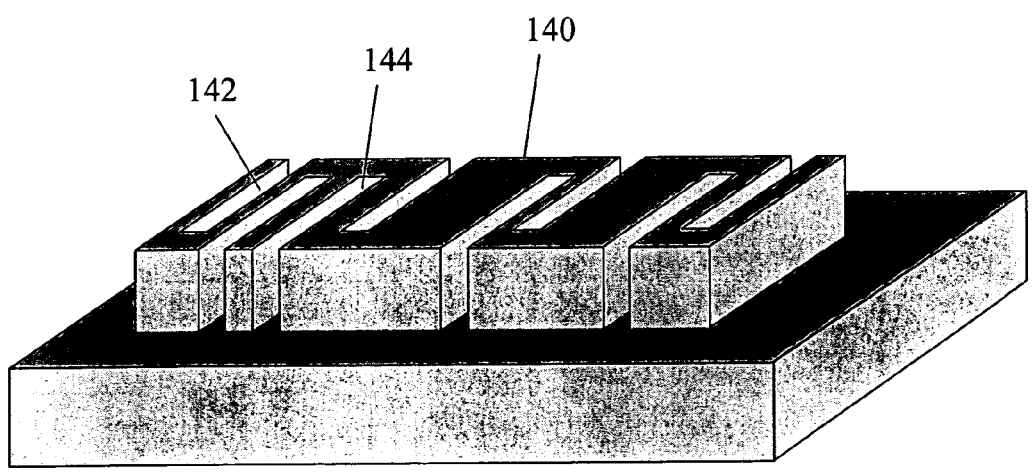
FIG. 5 shows a stage in the manufacture of a metal barcode with notches instead of holes.

An alternative design for a bar code structures is shown in FIG. 5. The barcode shown here is made from a strip with notches 142 along its sides instead of holes. This eliminates the presence of small pieces of debris when the barcode structure is made. When the substrate is dissolved, waste material from the notches remains attached to the waste material surrounding the strip, therefore is held in place more securely while the barcode itself is released. Some of the notches 142 adjoin a first edge of the strip 140, and other notches 144 adjoin the opposite edge of the strip. Thus, the barcode forms a "snake-like" structure.

A further use of the invention is to make planar test devices, such as motion sensors and accelerometers. FIG. 6A shows an example of an accelerometer design. The grey areas show deposited metal and the white areas show spaces between the areas of metal. The accelerometer is made up of a central mass 160 fixed by suspension means 162 to allow it to move from side to side along direction A. The holes 168 allow the substrate to be dissolved immediately underneath the central mass 160. The central mass 160 has a comb structure 164 attached to it. This is interleaved with a stationery comb structure 166. When the device is subjected to an acceleration, the distance separating the arms of the two comb structures changes. Thus the capacitance changes, and this can be measured to determine the acceleration. The measurement of acceleration is made more accurate by the fact that the stationary comb structure is divided into four separate parts, each part with a separate electrical contact. Thus, four separate measurements of capacitance can be made.

Two parts of the comb structure are on one side of the central mass 160, and the other two parts are on the other side. This allows the effects of a small sideways movement (perpendicular to direction A of FIG. 6A) of the central mass 160 to be compensated for. On each side of the central mass 160, the two comb structure parts have different positionings with respect to the arms of the central mass 160. One of the comb structure parts is arranged to increase in separation from the arms of the central weight 160 when a "forward" acceleration occurs along direction A, and decrease when a "reverse" acceleration occurs along direction A. The other is arranged to increase in separation when a "reverse" acceleration occurs, and decrease when a "forward" acceleration occurs. The results of the two measurements can be averaged to give a more accurate acceleration reading. In a device using the structure of FIG. 6A, means may be provided to measure and compare all four capacitance readings, and use them to calculate an accurate value of the acceleration.

Figure 6B:
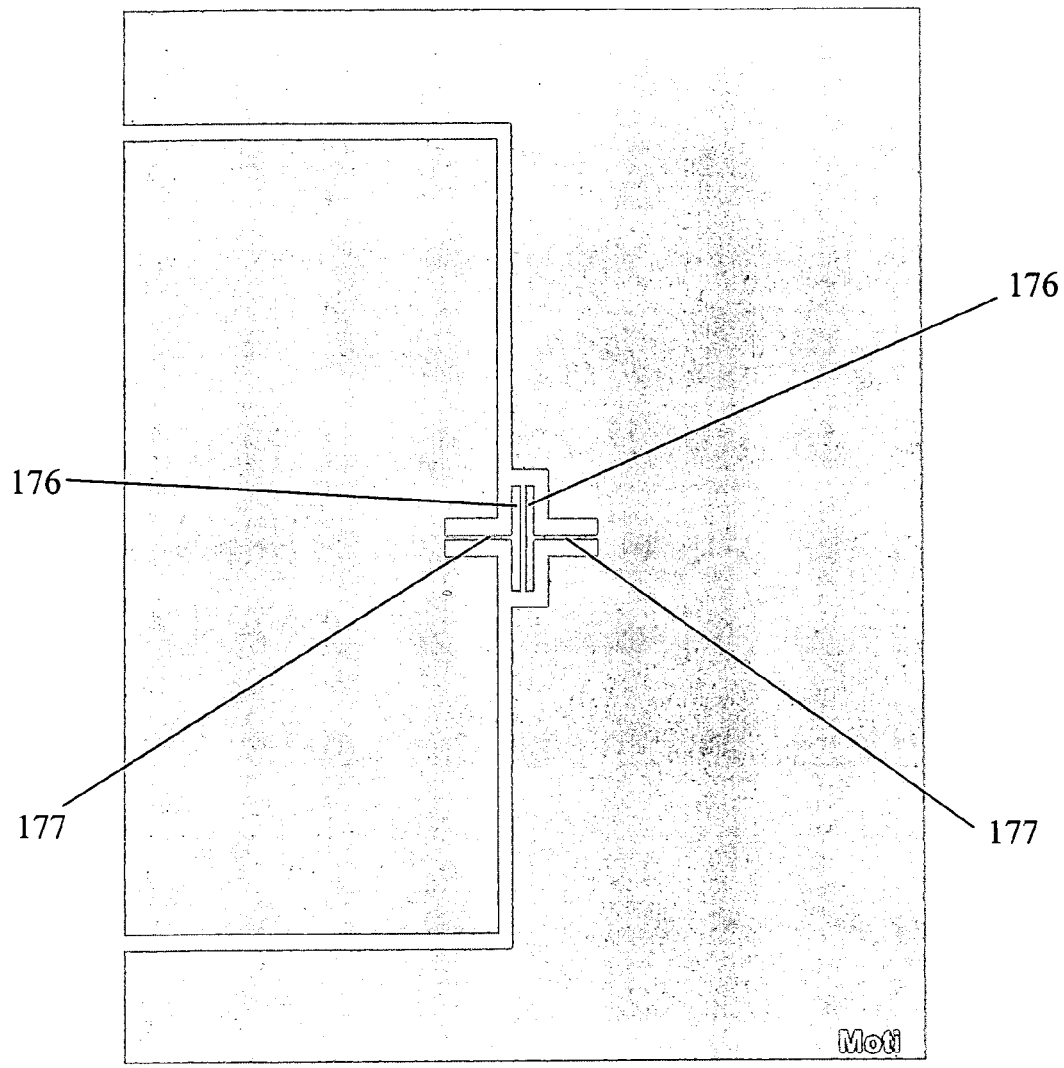
FIG. 6B shows an example design for a motion sensor made according to the method of the invention.

FIG. 6B shows an example of a motion sensor design. The motion sensor has two parallel masses 176 suspended on thin arms 177. Any accelerating forces will cause the plates to move relative to one another, thereby changing the capacitance. This type of sensor would be useful for detecting whether excessive motion had occurred during shipping of fragile goods, which could be very useful for insurance companies who were insuring the goods.

Figure 6C:
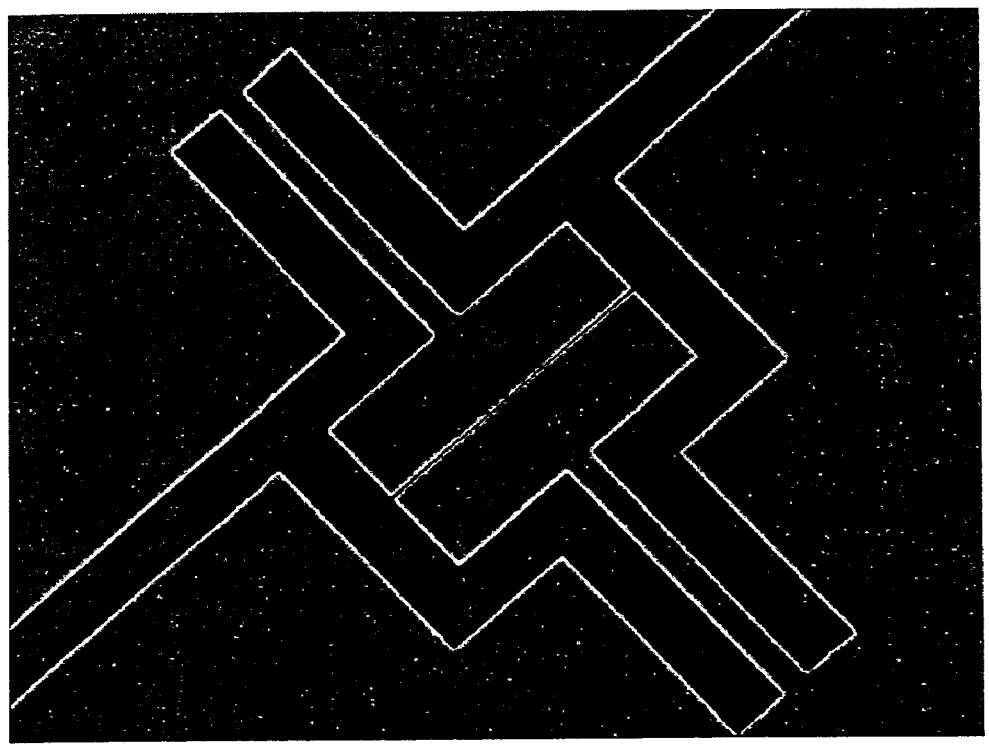
FIG. 6C shows a SEM micrograph of a metal layer deposited on cellulose acetate, to form a motion detector according to the invention.

FIG. 6C is a SEM micrograph showing a real example of a motion sensor made according to the invention. A metal layer has been deposited onto a cellulose acetate substrate. Within the metal layer, two masses have been formed, each of which is suspended on a thin arm. The substrate has not yet been dissolved in the structure shown, but this can be done so that the masses become freestanding.

Figure 7A:
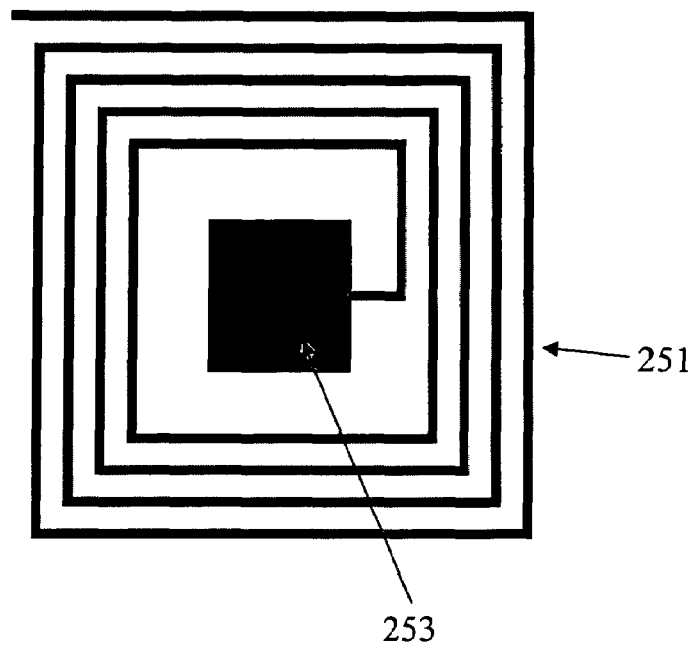
FIGS. 7A-C show three example designs for a micro antenna made using the methods of the invention.
Figure 7B:
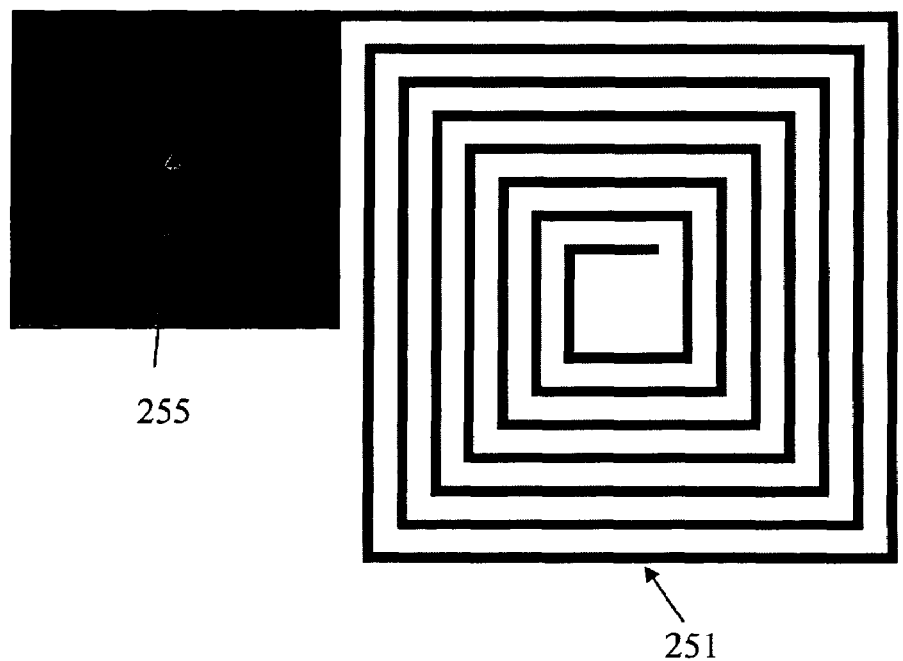
Figure 7C:
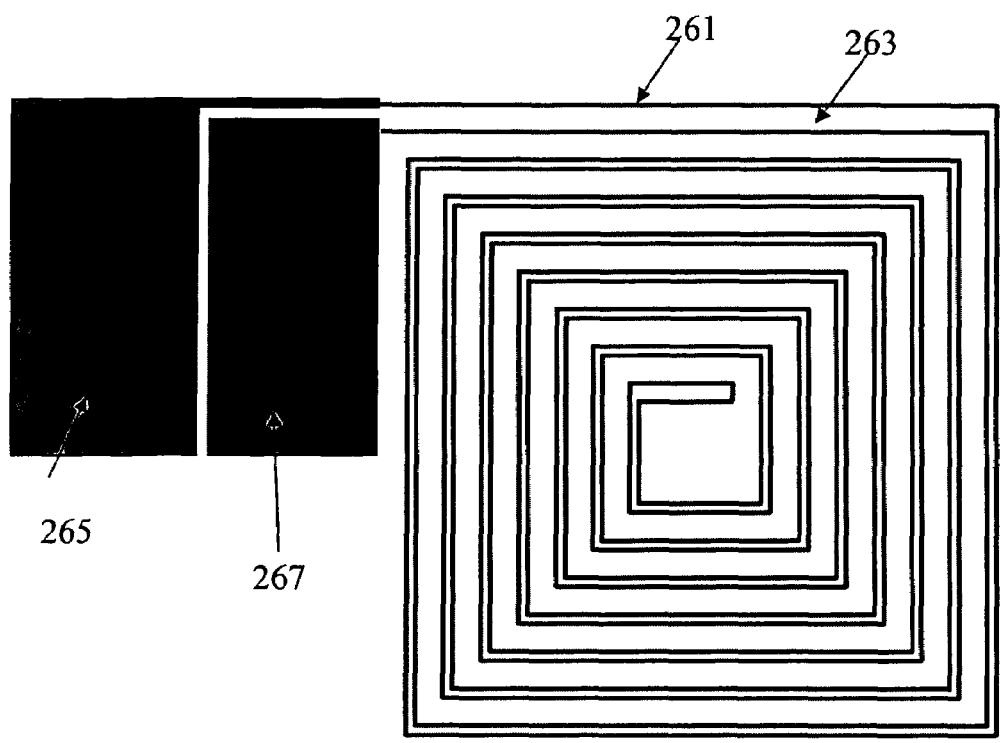

A further device which could be made using the invention is a miniature antenna. FIGS. 7A to C show three example of such an antenna.

The antenna of FIG. 7A comprises a spiral track 251 which generally follows a square pattern. The end of the spiral at its centre is joined to a contact pad 253. A silicon chip, such as an RF chip, may be attached to the contact pad.

The antenna of FIG. 7B again comprises a spiral track 251 which follows a generally square pattern spiral shape. The outer end of the spiral is joined to a contact pad 255. Again, a silicon chip, such as an RF chip, may be attached to the contact pad.

The antenna of FIG. 7C comprises two tracks 261, 263 wound together in a complementary spiral formation. The two tracks are joined at the centre of the spiral such that together the two tracks form a loop.

The outermost end of one of the tracks is connected to a first contact pad 265 and the outermost end of the other track is connected to a second contact pad 267.

The antenna may be useful for applications such as smart labels and bluetooth devices. It is also possible to make fractal shaped antennas. These occupy space more efficiently than more traditional designs, and they can be useful for multiband operation.

Figure 8A:
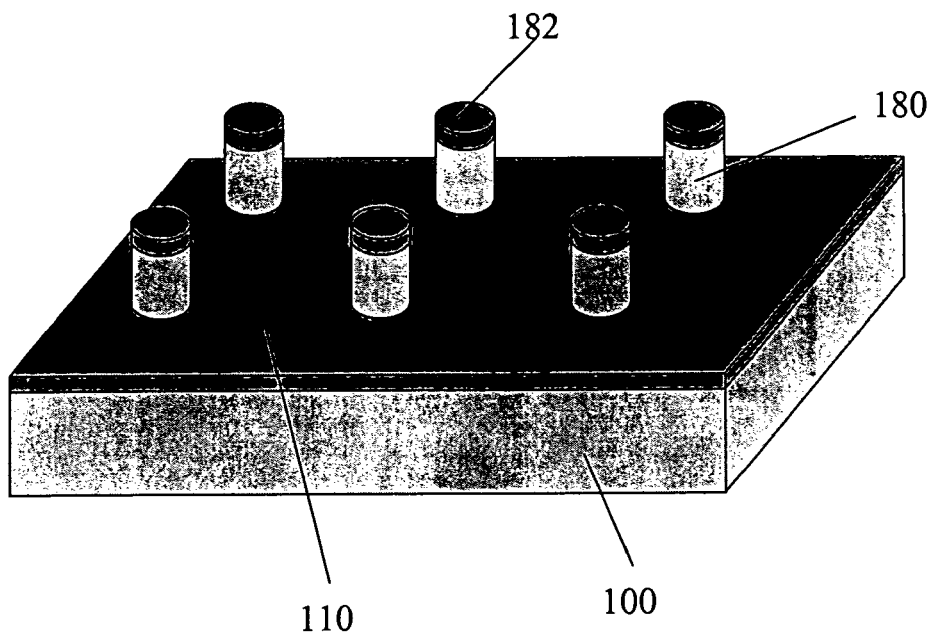
FIGS. 8A and 8B show the production of particles using the methods according to the first embodiment of the invention.
Figure 8B:
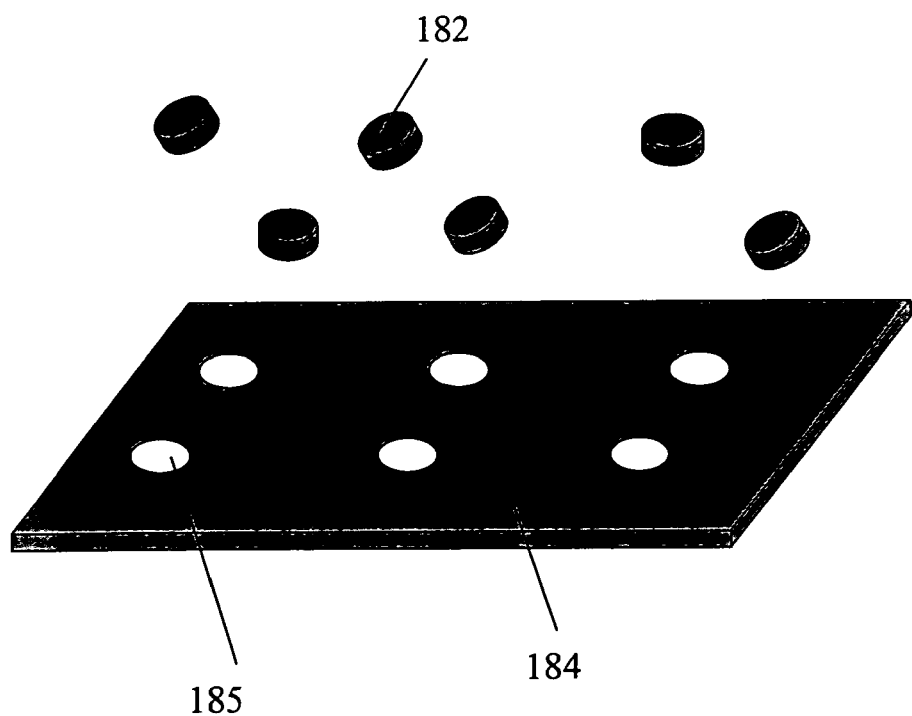

Yet another use of the method of the invention is for making large numbers of particles of custom size and shape. FIG. 8A and 8B show the method of the invention in use to produce of a plurality of micro particles. The metal layer left behind on the substrate forms a micro-porous membrane or a nano-porous membrane. This membrane may be flexible, rigid or semi-rigid.

FIG. 8A shows an example of a substrate 100 shaped with cylindrical pillars 180 for making such particles. When the metal layer 110 is deposited onto the substrate, circular metal particles 182 are formed on top of the pillars. FIG. 8B shows the particles being released after the substrate has been dissolved. The remaining sheet of metal left on the surface of the substrate 100 forms a mesh or membrane structure 184. A mesh made in this way could be used for filtering on a micron scale, or for providing a support platform on which to grow cells. A support platform can encourage growth of cells, enabling them to knit together with higher spatial precision, as required for (e.g.) nerve fibre regrowth or bone regrowth.

Figure 9A:
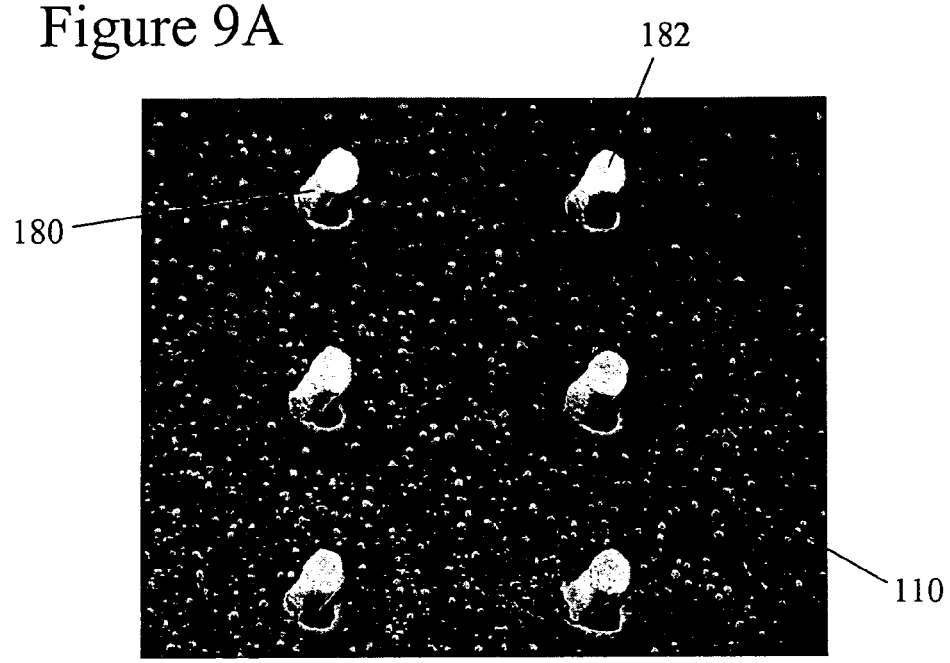
FIGS. 9A and 9B are micrographs of the production of disk shaped particles.
Figure 9B:
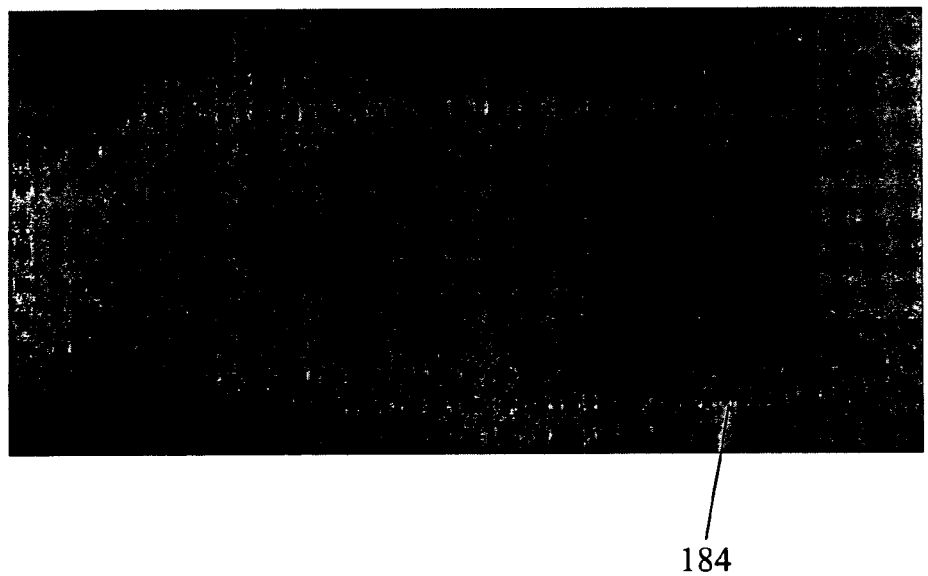

An example of particle formation, as described in FIG. 8A and B, is shown in FIGS. 9A and B. FIG. 9A shows a substrate with six cylindrical pillars 180. The substrate and the tops of the pillars have been coated with a metal layer 110, forming particles 182 on top of the pillars. FIG. 9B shows an optical micrograph of the remaining sheet of metal after the substrate has been dissolved. It now has a regular array of holes corresponding to the removed particles 182, thus forming a net type structure 184.

Figure 9C:
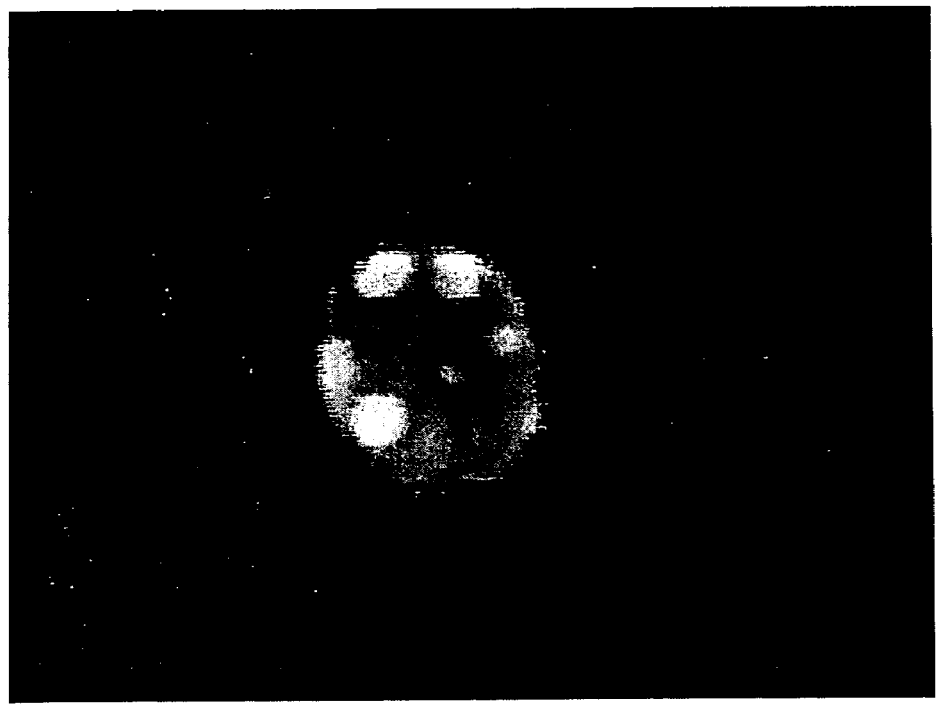
FIG. 9C is a micrograph of a particle of 150 nm diameter, made using the method of the invention.

FIG. 9C is a micrograph of a particle with a diameter of 150 nm, formed using the soluble substrate technique according to the invention. It is not trivial to make particles of this size.

A more complex example of particle formation is shown in FIG. 10. FIGS. 10A and 10B show an optical photograph and a SEM photograph respectively of a substrate before dissolution. The substrate is shaped with a large number of ring shapes of raised relief, arranged in a grid pattern. The rings have a 4 μm outer diameter and a 2 μm inner diameter. A metal layer is deposited onto the substrate, forming metal rings, metal particles and a metal membrane or mesh with an array of holes.

Figure 10A:
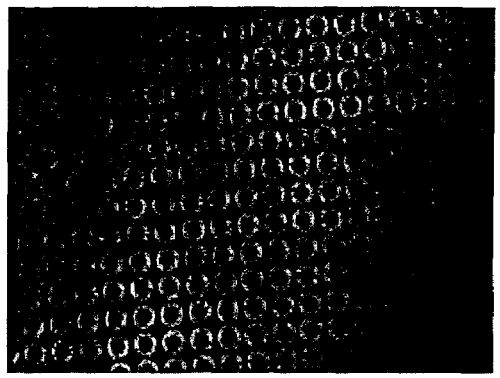
FIGS. 10A-E are micrographs of the production of 4 µm diameter rings and 2 µm particles.
Figure 10B:
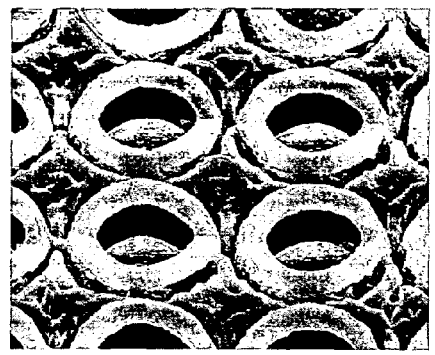
Figure 10C:
Figure 10D:
Figure 10E:

FIG. 10C shows freestanding 2 μm particles and 4 μm diameter rings after the substrate has been dissolved. FIGS. 10D and E show the substrate after the rings and particles have been removed, leaving a membrane with 4 μm holes.

Other shapes are also possible for the particles, in addition to the circular shape, and the ring shape.

Figure 11A:
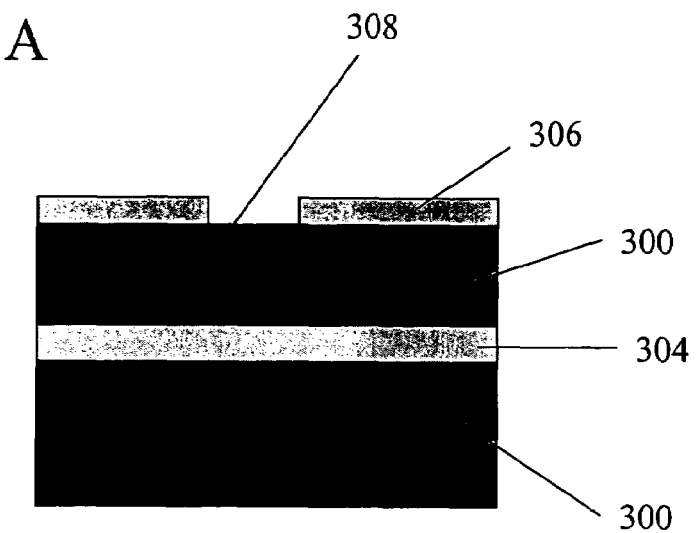
FIGS. 11A, B and C show three stages in the preparation of a mould from which a substrate can be made.
Figure 11B:
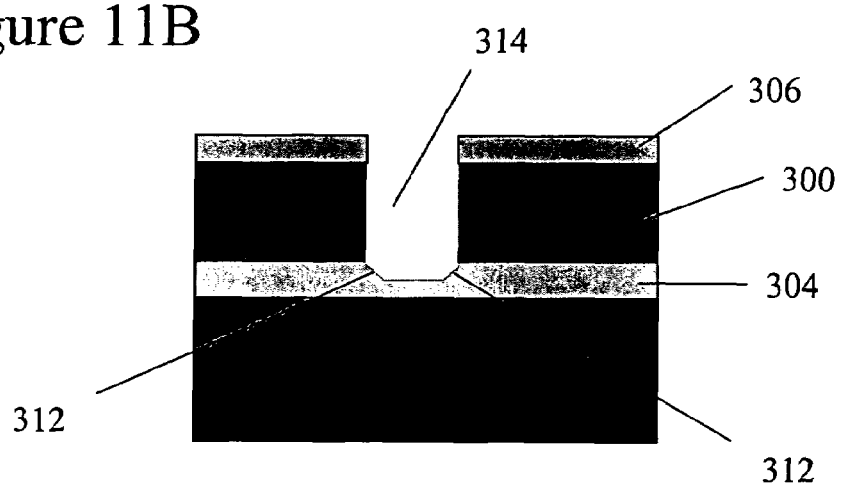
Figure 11C:
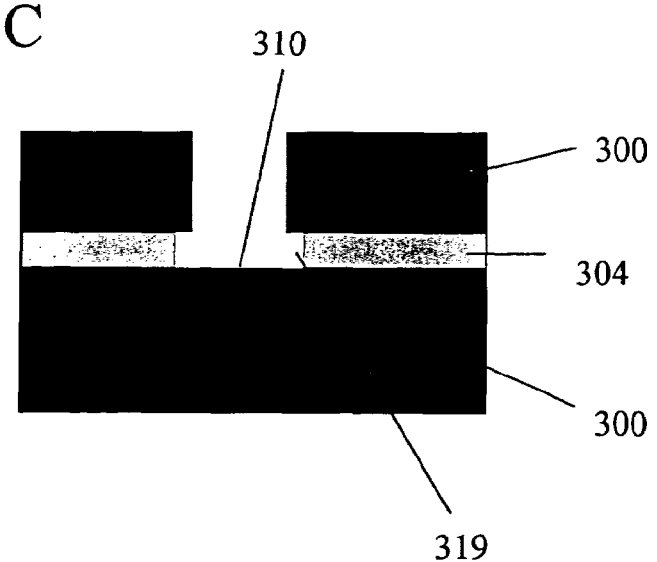

FIG. 11 shows a method of making a mould which is suitable for making the soluble substrates used in the invention. The mould must be accurately shaped, and of very good surface quality. Reactive ion etching, which is a standard method of etching moulds of this type, tends to give rounded corners and irregular surfaces. To avoid this problem, a two stage etching process is used. As shown in FIG. 11A, a section of mould material 300 is provided, with a sacrificial layer 304 below the surface of the mould material 300 and running parallel to the surface of the mould material.

The depth of the sacrificial layer determines the height of features such as pillars which will be formed on a substrate made from the mould. A masking layer 306 is deposited on top of the moulding material, and this masking layer is patterned to leave holes 308. Reactive ion etching is then carried out on the masked and patterned moulding material to produce etch pits which extend as deep as the sacrificial layer 304, but are prevented by the sacrificial layer 304 from being etched any deeper. This is shown in FIG. 11B. Due to the nature of reactive ion etching, the surface quality of the inside of the pit 314 is not good. The surface is rough and the corners 312 may be rounded. A second etching stage is then carried out using a wet etch. The wet etch etches out part of the sacrificial layer directly at the bottom of the pit 310. Slight undercutting 319 of the mould material surrounding the pit may also occur. A good quality surface is produced at the bottom of the pit and any rounded corners are tidied.

This method allows moulds to be produced which have structures on a 10 nm scale. It is not trivial to produce such small structures. The sacrificial layer may be a buried doped layer or may be a layer of a different material to the rest to the mould material. An alternative to using a wet etch is to use another type of edge which is selective in etching the buried doped sacrificial layer.

Once the mould has been made, a substrate may be formed by injection moulding or by rolling.

Figure 12:
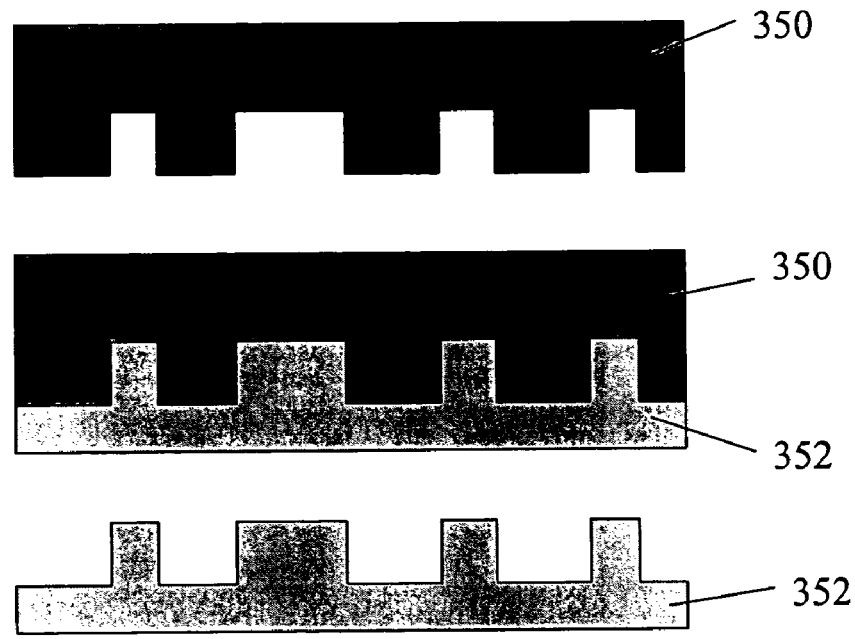
FIG. 12 shows the use of the mould to injection mould substrate.

FIG. 12 shows the arrangement for injection moulding of a substrate. A mould 350 is shown. The fluid substrate 352 is injected below the patterned surface of the mould, and allowed to harden. The mould is then remove to leave a patterned substrate, having a complementary pattern to that of the mould.

Figure 13:
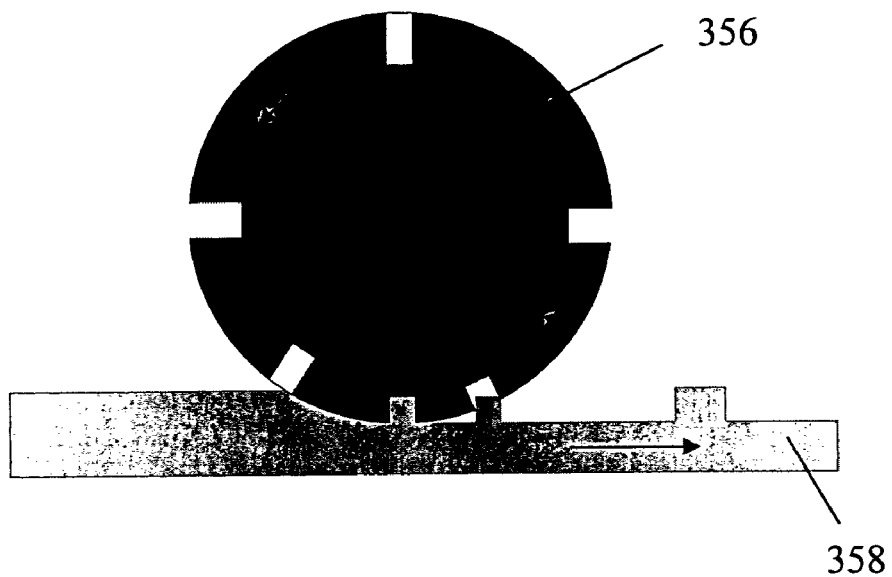
FIG. 13 shows the use of a roller type mould to continuously roll out a pattern on a substrate.

FIG. 13 shows production of a patterned substrate by rolling. The mould is shaped as a cylinder with pattern surface 356. The cylinder is then rolled across the surface of substrate 358, pressing into it and thus imprinting a pattern of ridges and holes on the substrate. The advantage of this rolling process is that it continuous and the substrate can be produced in a continuous flow.

The invention claimed is:

1. A method of producing a free standing structure, the method comprising:
    providing a patterned soluble substrate having a raised pattern formed on a surface of said substrate, said raised pattern having side walls and comprising at least one material which forms said surface;
    depositing material over said raised pattern, said deposition being directional such that material is not deposited onto the side walls of the raised pattern; and
    dissolving said substrate to release said deposited material to form said free standing structure from said released deposited material;
    wherein said free standing structure has a code defined by said raised pattern, said code being an optically readable pattern of text, holes, grooves or notches to identify said structure from similar free standing structures.

2. The method of claim 1, wherein said raised pattern defines a planar surface.

3. The method of claim 1, wherein said raised pattern comprises a 3D relief pattern.

4. The method of claim 1, wherein said substrate comprises a plurality of patterns of lower relief than said raised pattern, each of said plurality of patterns being separated by a step from said raised pattern and from the other patterns in said plurality of patterns, and said method further comprises:
    depositing material over each of said patterns in said plurality of patterns.

5. The method of claim 1, wherein said depositing comprises depositing of an aluminium layer.

6. The method of claim 1, wherein said depositing produces a layer of material of thickness between 10 nm and 10 μm.

7. The method of claim 1, wherein said free standing structure comprises capacitance members for a motion sensor or accelerometer.

8. The method of claim 1, wherein said free standing structure is an antenna structure.

9. The method of claim 1, further comprising using a mould to produce a plurality of substrates, by one of injection moulding or pressing.

10. The method of claim 9, wherein said mould is a roller shape, and said pressing is carried out by rolling said mould across the surface of the substrate.

11. The method of claim 1, wherein said substrate comprises a second pattern of lower relief than said raised pattern, said second pattern being separated from said raised pattern by a step, and said method further comprises:
    depositing material over said second pattern.

12. The method of claim 11, wherein said dissolving dissolves only part of said substrate to release said deposit material from said raised pattern but not from said second pattern.

13. The method of claim 12, further comprising:
    dissolving said substrate in a second dissolving process, to release deposit material to form a free standing structure comprised of said deposit material from said second pattern.

14. A method of producing a free standing structure, the method comprising:
    providing a patterned soluble substrate having a raised pattern formed on a surface of said substrate, said raised pattern having side walls and comprising at least one material which forms said surface;
    depositing material over said raised pattern, said deposition being directional such that material is not deposited onto the side walls of the raised pattern; and
    dissolving said substrate to release said deposited material to form said free standing structure from said released deposited material;
    wherein said free standing structure has a code defined by said raised pattern and is a bar code tag.

15. The method of claim 14, wherein said bar code tag comprises a strip with a plurality of holes, the positions of the holes determining the unique code of the strip.

16. The method of claim 14, wherein said bar code tag comprises a strip with a plurality of notches cut into the sides of said strip, the positions of the notches determining the unique code of the tag.

17. A method of producing a free standing structure, the method comprising:
    providing a patterned soluble substrate having a raised pattern formed on a surface of said substrate, said raised pattern having side walls and comprising at least one material which forms said surface;
    depositing material over said raised pattern, said deposition being directional such that material is not deposited onto the side walls of the raised pattern;
    dissolving said substrate to release said deposited material to form said free standing structure from said released deposited material;
    wherein said free standing structure has a code defined by said raised pattern; and
    using a mould to produce a plurality of substrates, by one of injection moulding or pressing, the mould being produced by:
    providing a mould material having a buried sacrificial layer, said sacrificial layer being parallel to a main surface of said mould material;
    masking the main surface of said mould material with a mask pattern;
    etching the mould material through said mask pattern with a first etch;
    stopping said first etch at an etch stop level within said sacrificial layer; and
    etching the mould material with a second etch to selectively remove the sacrificial layer below said etch stop level.

18. The method of claim 17, wherein said first etch comprises reactive ion etching or laser etching.

19. The method of claim 17, wherein said second etch comprises a wet etch.

20. The method of claim 17, comprising a further etching stage wherein a surface which is non parallel to the main surface is etched.

21. A method of producing a plurality of free standing structures, the method comprising:

providing a patterned soluble substrate having a raised pattern formed on a surface of said substrate, said raised pattern having side walls and comprising at least one material which forms said surface;

depositing material over said raised pattern, said deposition being directional such that material is not deposited onto the side walls of the raised pattern; and dissolving said substrate to release said deposited material to form a plurality of free standing structures from said released deposited material;

wherein said free standing structures have a code defined by said raised pattern, said code being an optically readable pattern of text, holes, grooves or notches to identify said structures.

* * * * *